United States Patent
Koizumi

(10) Patent No.: US 12,154,659 B2
(45) Date of Patent: *Nov. 26, 2024

(54) MEMORY SYSTEM AND METHOD OF CONTROLLING A MEMORY CHIP

(71) Applicant: Kioxia Corporation, Tokyo (JP)

(72) Inventor: Shinya Koizumi, Kamakura (JP)

(73) Assignee: Kioxia Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/488,089

(22) Filed: Oct. 17, 2023

(65) Prior Publication Data

US 2024/0046971 A1 Feb. 8, 2024

Related U.S. Application Data

(63) Continuation of application No. 17/304,129, filed on Jun. 15, 2021, now Pat. No. 11,830,576.

(30) Foreign Application Priority Data

Dec. 14, 2020 (JP) .................................. 2020-206820

(51) Int. Cl.
  *G11C 7/22* (2006.01)
  *G06F 1/08* (2006.01)
  (Continued)

(52) U.S. Cl.
  CPC .............. *G11C 7/222* (2013.01); *G06F 13/18* (2013.01); *G11C 7/1063* (2013.01);
  (Continued)

(58) Field of Classification Search
  CPC ............. G06F 13/1689; G06F 13/4243; G06F 13/4234; G06F 13/1668; G06F 1/08;
  (Continued)

(56) References Cited

U.S. PATENT DOCUMENTS 6,535,986 B1  3/2003  Rosno
7,382,679 B2  6/2008  Koga
(Continued)

OTHER PUBLICATIONS

Liu et al., "DI-SSD: Desymmetrized Interconnection Architecture and Dynamic Timing Calibration for Solid-State Drives", 23rd Asia and South Pacific Design Automation Conference, 2018, 6 pages.

*Primary Examiner* — Ji H Bae
(74) *Attorney, Agent, or Firm* — Oblon, McClelland, Maier & Neustadt, L.L.P.

(57) ABSTRACT

A memory system includes a memory chip and a memory controller that controls the memory chip. In a write operation, the memory controller transfers a first timing signal synchronized with a first clock and first data synchronized with the first timing signal to the memory chip. In a read operation, the memory controller transfers a second timing signal synchronized with at least a second clock to the memory chip. The second clock has a frequency different from a frequency of the first clock. In the read operation, the memory chip generates a third timing signal synchronized with the second clock based on the second timing signal, and transfers the third timing signal and second data synchronized with the third timing signal to the memory controller.

20 Claims, 6 Drawing Sheets

(51) Int. Cl.
  *G06F 13/16* (2006.01)
  *G06F 13/18* (2006.01)
  *G06F 13/42* (2006.01)
  *G11C 7/10* (2006.01)

(52) U.S. Cl.
  CPC .......... *G11C 7/1066* (2013.01); *G11C 7/1072* (2013.01); *G11C 7/1093* (2013.01); *G06F 1/08* (2013.01); *G06F 13/1668* (2013.01); *G06F 13/1689* (2013.01); *G06F 13/4234* (2013.01); *G06F 13/4243* (2013.01)

(58) Field of Classification Search
  CPC ....... G11C 7/222; G11C 13/18; G11C 7/1063; G11C 7/1066; G11C 7/1072; G11C 7/1093
  USPC .................................. 713/400, 600; 711/167
  See application file for complete search history.

(56) References Cited

U.S. PATENT DOCUMENTS

| | | | |
|---|---|---|---|
| 8,417,982 | B1 | 4/2013 | Amit |
| 8,775,701 | B1 | 7/2014 | Fung |
| 11,830,576 | B2 * | 11/2023 | Koizumi ................ G11C 7/222 |
| 2006/0069894 | A1 | 3/2006 | Hollis |
| 2007/0106836 | A1 | 5/2007 | Lee et al. |
| 2015/0098275 | A1 | 4/2015 | Kim |
| 2018/0225236 | A1 | 8/2018 | Suzuki et al. |
| 2020/0086930 | A1 | 3/2020 | Yamamoto |
| 2021/0043240 | A1 | 2/2021 | Mun |
| 2021/0383848 | A1 | 12/2021 | Jeong |
| 2022/0011974 | A1 | 1/2022 | Lee |

* cited by examiner

MEMORY SYSTEM AND METHOD OF CONTROLLING A MEMORY CHIP

CROSS-REFERENCE TO RELATED APPLICATIONS

This application is a continuation of and claims the benefit of priority from 35 U.S.C. § 120 from U.S. application Ser. No. 17/304,129 filed Jun. 15, 2021, and claims the benefit of priority under 35 U.S.C. § 119 from Japanese Patent Application No. 2020-206820 filed Dec. 14, 2020, the entire contents of each of which are incorporated herein by reference.

FIELD

Embodiments described herein relate generally to a memory system and a method of controlling a memory chip.

BACKGROUND

A memory system including a memory controller and a plurality of memory chips has been commonly used. There are requests for heightening a data transfer frequency between the memory controller and each of the memory chips as much as possible.

DETAILED DESCRIPTION

According to one embodiment, in general, a memory system includes a memory chip and a memory controller that controls the memory chip. In a write operation, the memory controller transfers a first timing signal synchronized with a first clock and first data synchronized with the first timing signal to the memory chip. In a read operation, the memory controller transfers a second timing signal synchronized with at least a second clock to the memory chip. The second clock has a frequency different from a frequency of the first clock. In the read operation, the memory chip generates a third timing signal synchronized with the second clock based on the second timing signal, and transfers the third timing signal and second data synchronized with the third timing signal to the memory controller.

Exemplary embodiments of the memory system will be explained below in detail with reference to the accompanying drawings. The following embodiments are presented for illustrative purposes only and unintended to limit the scope of the present invention.

EMBODIMENT

Figure 1:
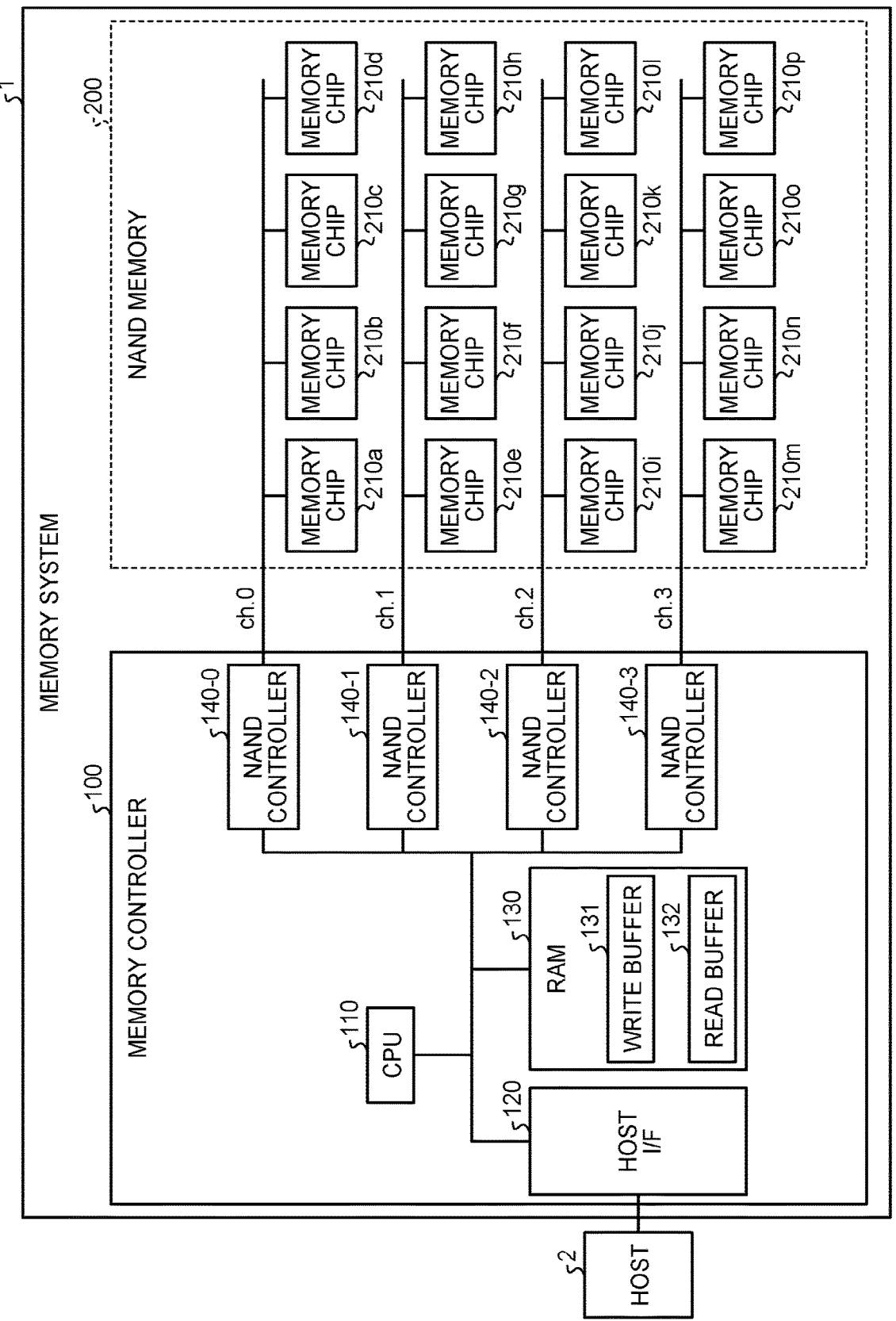
FIG. 1 is a schematic diagram illustrating an exemplary configuration of a memory system connected to a host, according to an embodiment.

FIG. 1 is a schematic diagram illustrating an exemplary configuration of a memory system of an embodiment, which is connected to a host. A memory system 1 is connectable to a host 2. The standard of a communication channel between the memory system 1 and the host 2 is not limited to any particular standard. Serial attached SCSI (SAS) can be adopted by way of example.

Examples of the host 2 include, but are not limited to, a personal computer, a personal digital assistant, and a server. The memory system 1 can receive access requests such as a read request or a write request from the host 2.

The memory system 1 includes a memory controller 100 and a NAND flash memory (NAND memory) 200. The NAND memory 200 includes a plurality of memory chips 210. The type of the memory chips 210 is not limited to the NAND flash memory.

The NAND memory 200 includes sixteen memory chips 210a to 210p as the plurality of memory chips 210. The sixteen memory chips 210 of the NAND memory 200 are connected to the memory controller 100 via four corresponding channels (ch. 0 to ch. 3).

In the example illustrated in FIG. 1, the memory chips 210a to 210d are connected in common to the channel #0 (ch. 0). The memory chips 210e to 210h are connected in common to the channel #1 (ch. 1). The memory chips 210i to 210l are connected in common to the channel #2 (ch. 2). The memory chips 210m to 210p are connected in common to the channel #3 (ch.3).

Each of the channels is configured as a group of signal lines. The memory controller 100 is capable of individually controlling the channels. The memory controller 100 can simultaneously operate the memory chips 210 connected to different channels by individually controlling the channels. An exemplary configuration of the channels will be described later.

The number of memory chips 210 included in the memory system 1 is not limited to 16. The number of channels included in the memory system 1 is not limited to 4. The number of memory chips 210 connected to each channel is not limited to 4.

The memory controller 100 includes a central processing unit (CPU) 110, a host interface (I/F) 120, a random access memory (RAM) 130, and the same number of NAND controllers 140 as the channels (herein, four). The memory controller 100 can be configured as, for example, a System-On-a-Chip (SoC). The memory controller 100 may include a plurality of chips.

The RAM 130 can be used as data transfer buffers between the host 2 and the NAND memory 200. Specifically, a write buffer 131 is allocated in the RAM 130. The write buffer 131 buffers data before the data is transferred to the NAND memory 200. A read buffer 132 is allocated in the RAM 130. The read buffer 132 buffers data read from the NAND memory 200. In addition to the data transfer buffers, the RAM 130 can function as, for example, a working area of the CPU 110 and/or a cache memory for various kinds of data.

The memory type of the RAM 130 is not limited to any particular type. For example, the RAM 130 can include a dynamic random access memory (DRAM), a static random access memory (SRAM), or a combination of both. The RAM 130 may be a separated chip from the memory controller 100 in the memory system 1.

The host I/F 120 controls transmission and reception of information, such as access requests, responses, and data, between the host 2 and the memory controller 100. For example, the host I/F 120 receives an access request from the host 2. The host I/F 120 receives data from the host 2 and stores the data in the write buffer 131 inside the RAM 130. The host I/F 120 transmits stored data, read from the NAND memory 200, from the read buffer 132 inside the RAM 130 to the host 2.

The CPU 110 is a processor that operates in accordance with a program such as a firmware program. The CPU 110 controls the overall operation of the memory controller 100. The CPU 110's control over the overall operation of the memory controller 100 includes, for example, determinations of an access destination in the NAND memory 200, the type of accesses to the NAND memory 200, and the order of accesses to the NAND memory 200. The type of accesses includes write operation and read operation, for example.

The NAND controllers 140 are connected to the four corresponding channels #0 to #3. In FIG. 1, the NAND controller 140 connected to the channel #i is denoted as the NAND controller 140-$i$. The letter "i" represents an integer of zero or more and three or less. One of the NAND controllers 140 executes access to the four memory chips 210 via the corresponding channel, in accordance with the setting made by the CPU 110. At the time of accessing the memory chips 210, the NAND controller 140 transfers, for example, a command, an address, and data to the memory chips 210 via the channel.

The functions of each element of the memory controller 100 may be implemented by dedicated hardware circuitry or by the CPU 110's executing a program.

Figure 2:
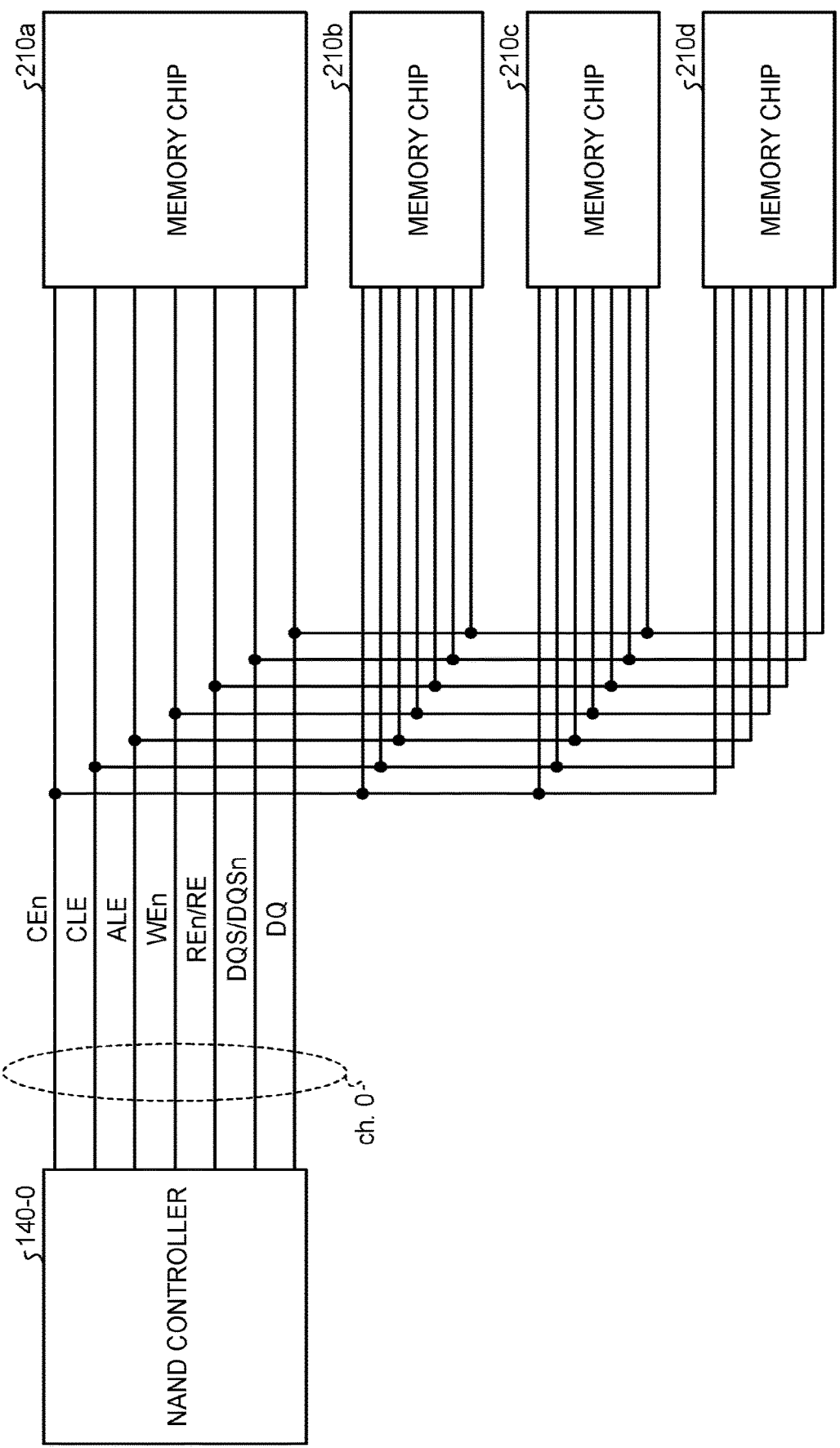
FIG. 2 is a schematic diagram illustrating an exemplary configuration of a channel according to the embodiment.

FIG. 2 is a schematic diagram illustrating an exemplary configuration of the channel according to the embodiment. The four channels have the same configuration. The configuration of the channel #0 will be described as a representative of the four channels, with reference to FIG. 2.

The channel #0 includes a chip enable signal line CEn, a command latch enable signal line CLE, an address latch enable signal line ALE, a write enable signal line WEn, a pair of read enable signal lines REn/RE, a pair of data strobe signal lines DQS/DQSn, and an input-and-output (IO) signal line DQ.

The chip enable signal line CEn is used for transferring a chip enable signal CEn. The chip enable signal CEn places the memory chip 210 of an access target in an enable state.

The IO signal line DQ is used for transferring a signal DQ. The signal DQ may include a command, an address, or data. The IO signal line DQ has a bit width of, for example, 8 bits. The bit width of the IO signal line DQ is not limited thereto.

The command latch enable signal line CLE is used for transferring a command latch enable signal CLE. The command latch enable signal CLE indicates that the signal DQ being transferred through the IO signal line DQ is a command. In transferring the signal DQ as a command, the NAND controller 140-0 transfers the command latch enable signal CLE.

The address latch enable signal line ALE is used for transferring an address latch enable signal ALE. The address latch enable signal ALE indicates that the signal DQ being transferred through the IO signal line DQ is an address. In transferring the signal DQ as an address, the NAND controller 140-0 transfers the address latch enable signal ALE.

The write enable signal line WEn is for transferring a write enable signal WEn. The write enable signal WEn serves as a timing signal representing acquiring timing of a command or an address transferred as the signal DQ. Thus, a command and an address are transferred in synchronization with the write enable signal WEn. In transferring the signal DQ as a command or an address, the NAND controller 140-0 transfers the write enable signal WEn.

The pair of read enable signal lines REn/RE is used for transferring a pair of read enable signals REn/RE. The pair of read enable signals REn/RE is configured as a differential signal. In FIG. 2, the pair of read enable signal lines REn/RE is represented by a single line for the sake of simplicity. The pair of read enable signals REn/RE serves as a timing signal used by the NAND controller 140-0 to instruct the memory chip 210 as to a data output timing. In the following, the read enable signal REn will be described as a representative of the pair of read enable signals REn/RE. A description of the read enable signal RE will be omitted.

The pair of data strobe signal lines DQS/DQSn is for transferring a pair of strobe signals DQS/DQSn. The pair of strobe signals DQS/DQSn is configured as a differential signal. In FIG. 2, the pair of strobe signals DQS/DQSn is represented by a single line for the sake of simplicity. The pair of strobe signals DQS/DQSn serves as a timing signal for instructing a transfer destination as to a data acquiring timing at the time of data transfer. In a write operation, the NAND controller 140-0 transmits the pair of strobe signals DQS/DQSn. That is, in the write operation, data transfer occurs in synchronization with the pair of strobe signals DQS/DQSn transmitted by the NAND controller 140-0. In a read operation, one of the four memory chips 210$a$ to 210$d$, i.e., the memory chip 210 being to output data, transmits the pair of strobe signals DQS/DQSn. That is, in the read operation, data transfer occurs in synchronization with the pair of strobe signals DQS/DQSn transmitted by the memory chip 210 serving as the output source. Hereinafter, the strobe signal DQS will be described as a representative of the pair of strobe signals DQS/DQS. A description of the strobe signal DQSn will be omitted.

Each channel configuration is not limited to the example described above. Each of the channels may include any signal line other than or in addition to the signal lines described above. The signal lines described above may be partly omitted.

In this manner, the signal lines connected to one NAND controller 140, in particular, the IO signal line DQ and the pair of data strobe signal lines DQS/DQSn, each branch into a plurality of branches. The branches are connected to different memory chips.

There are requests for heightening a data transfer frequency between a memory controller and each of memory chips, that is, the frequency of the signal DQ and the strobe signal DQS, as much as possible. An increased frequency of the signal DQ and the strobe signal DQS leads to improving the data transfer rate between the memory controller and the memory chips, thereby enhancing the performance of the memory system.

In a write operation, the memory controller (specifically, the NAND controller) drives the signal DQ and the strobe signal DQS of one channel that connects a write-target memory chip as well as the other memory chips. This is a large load for the memory controller driving the signal DQ and the strobe signal DQS, and makes the signal DQ and the strobe signal DQS susceptible to reflection. Thus, to make an eye opening of the signal DQ and the strobe signal DQS wider than a minimum desired level in the write operation, there may be a limitation to heightening the data transfer frequency.

Meanwhile, in a read operation, the memory chip drives the signal DQ and the strobe signal DQS for the memory controller (specifically, the NAND controller), so that it is easier to ensure a wider eye opening. Thus, even if the data transfer frequency is set higher in the read operation than in the write operation, the eye opening of the signal DQ and the strobe signal DQS can be still wider than the minimum desired level in the read operation.

That is, in the case of a memory system using only the same data transfer frequency in both the write operation and the read operation (hereinafter, referred to as a comparative memory system), for example, the data transfer frequency in the read operation is limited by the upper limit of the data transfer frequency in the write operation. Thus, the data transfer frequency in the read operation has room for increase.

The memory system 1 according to an embodiment is configured to transfer data in the read operation at a frequency different from that in the write operation. More specifically, in the read operation the memory system 1 uses, for data transfer, a strobe signal synchronized with a clock signal with a frequency higher than the frequency of a clock signal used in the write operation. Thereby, the memory system 1 can transfer data at a highest possible frequency in both of the write operation and the read operation.

From another point of view, in recent years, customers tend to place higher importance on the data read performance of the memory system than on the data write performance. In the memory system 1 of the embodiment, the memory chip 210 can transfer data to the memory controller 100 in the read operation at a frequency higher than the data transfer frequency in the write operation. This leads to improving the data read performance of the memory system 1, which results in meeting the customer requests at a higher level.

The NAND controller 140 according to the embodiment includes two phase locked loops (PLLs) to set, as the data transfer frequency, the frequency of a strobe signal synchronized with clocks having different frequencies in the read operation and the write operation.

Figure 3:
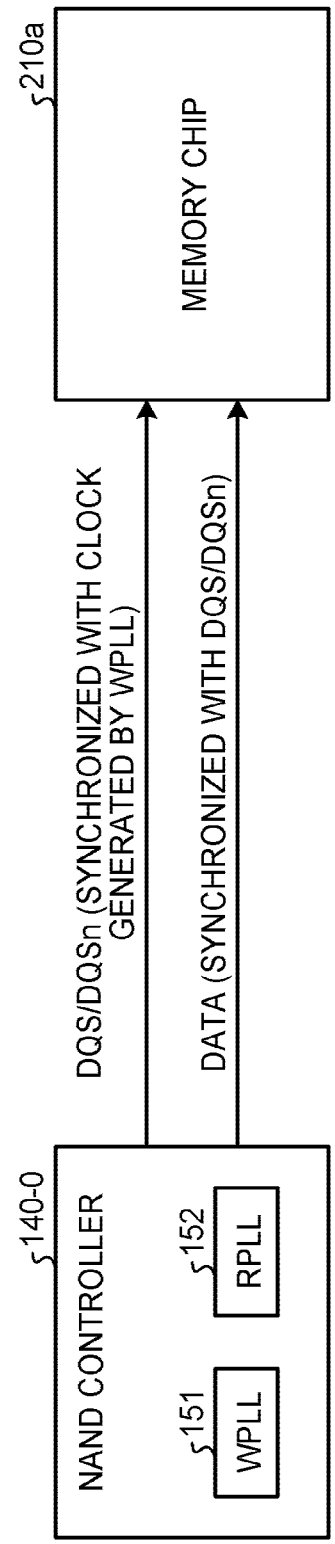
FIG. 3 illustrates part of signals transferred between a NAND controller and a memory chip in a write operation according to the embodiment.
Figure 4:
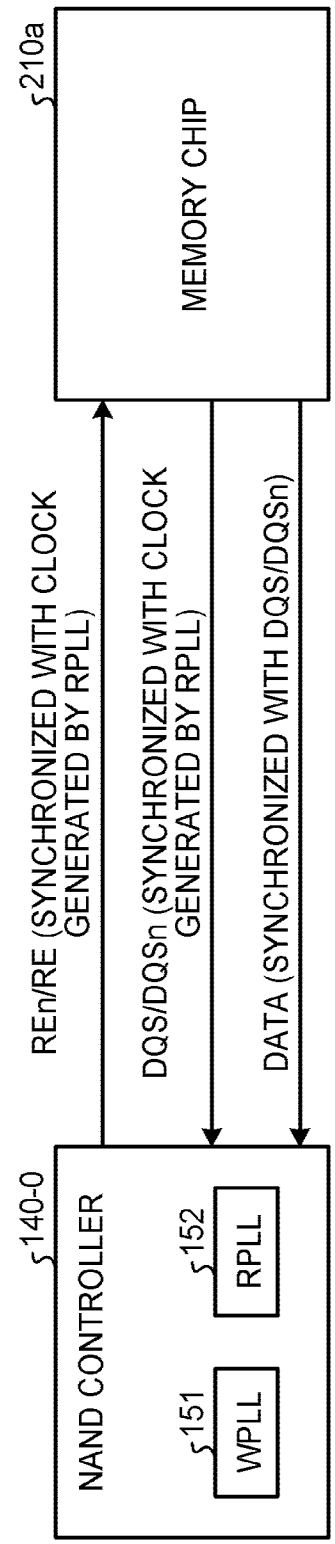
FIG. 4 illustrates part of signals transferred between the NAND controller and the memory chip in a read operation according to the embodiment.

The memory system 1 according to the embodiment will be generally described with reference to FIGS. 3 and 4. FIG. 3 illustrates part of the signals transferred between the NAND controller 140 and the memory chip 210 in the write operation according to the embodiment. The four NAND controllers 140 have the same configuration. The configuration of the NAND controller 140-0, which controls the channel #0, will be described as a representative of the four NAND controllers 140 with reference to FIGS. 3 and 4. Further, the sixteen memory chips 210 have the same configuration. FIGS. 3 and 4 omit illustrating the memory chips 210b to 210d among the four memory chips 210a to 210d connected to the channel #0.

The NAND controller 140-0 includes a write PLL (WPLL) 151 and a read PLL (RPLL) 152. The WPLL 151 generates a clock used in, for example, data transfer in the write operation. The RPLL 152 generates a clock used in, for example, data transfer in the read operation. The clock generated by the WPLL 151 is referred to as a write clock. The clock generated by the RPLL 152 is referred to as a read clock. The read clock may be set to a higher frequency than the write clock. The circuitry that generates the write clock is not limited to the PLL. The circuitry that generates the read clock is not limited to the PLL. The circuitry that generates the write clock and the circuitry that generates the read clock can be any clock generation circuits.

In the write operation, the NAND controller 140-0 transfers, to the memory chip 210a, the data strobe signal DQS synchronized with the write clock, that is, the clock generated by the WPLL 151. The NAND controller 140-0 also transfers, as the signal DQ, data synchronized with the data strobe signal DQS to the memory chip 210a. In other words, in the write operation, the data strobe signal DQS and the transferred data (signal DQ) are in synchronization with the write clock. The memory chip 210a acquires the received data as the signal DQ in accordance with the received data strobe signal DQS, and writes the acquired data to a memory cell array (a memory cell array 222 as described later).

FIG. 4 illustrates part of the signals transferred between the NAND controller 140 and the memory chip 210 in the read operation according to the embodiment.

In the read operation the NAND controller 140-0 transfers, to the memory chip 210a, the read enable signal REn synchronized with the read clock, that is, the clock generated by the RPLL 152. The memory chip 210a then generates the data strobe signal DQS from the read enable signal REn. The memory chip 210a transfers, to the NAND controller 140-0, the generated data strobe signal DQS as well as the signal DQ (read target data) synchronized with the data strobe signal DQS. In the read operation, thus, the data strobe signal DQS and the transferred data (the signal DQ) are in synchronization with the read clock. The NAND controller 140-0 acquires the transferred data as the signal DQ in accordance with the received data strobe signal DQS.

Figure 5:
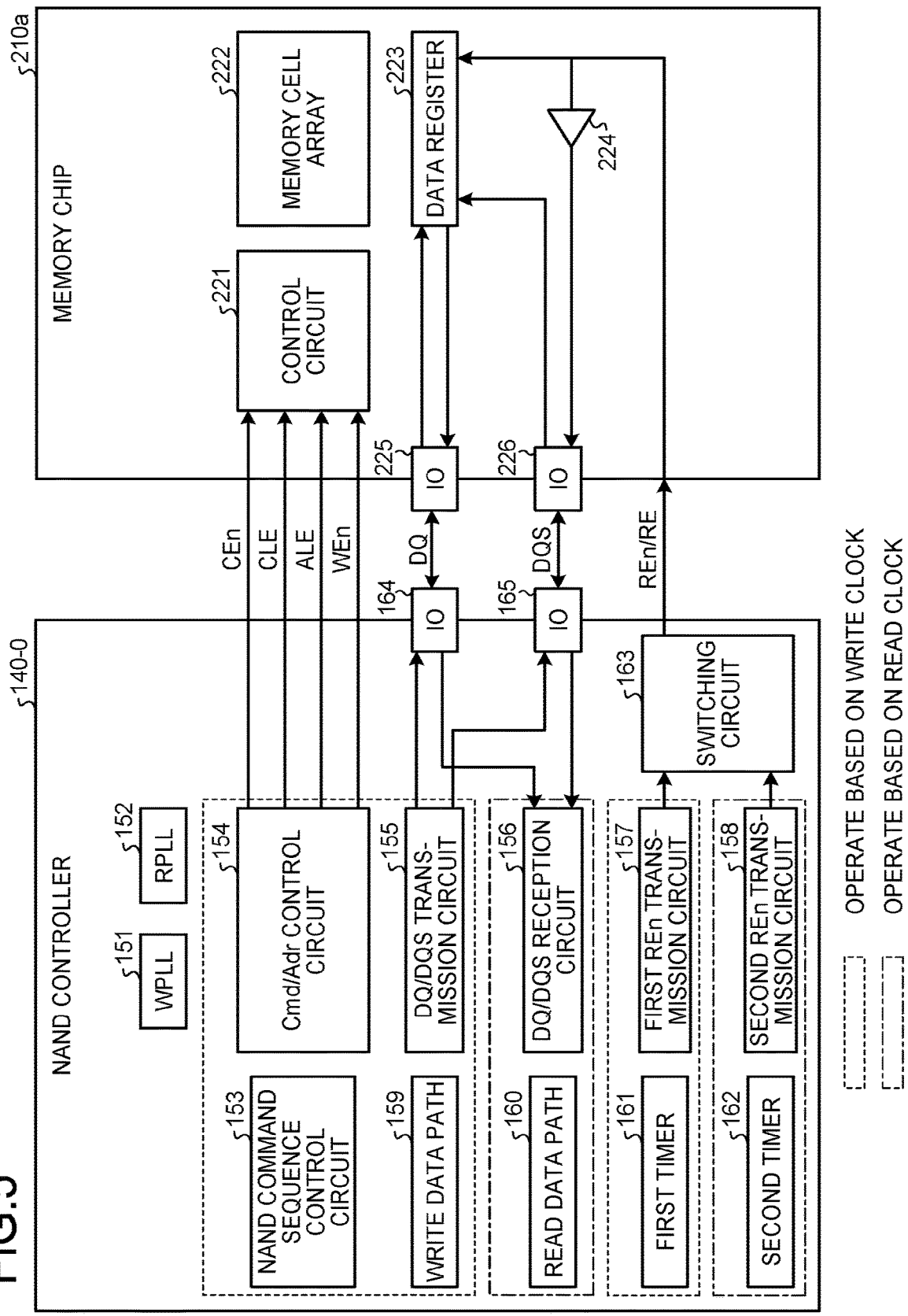
FIG. 5 is a schematic diagram illustrating detailed exemplary configurations of the NAND controller and the memory chip according to the embodiment.

FIG. 5 is a schematic diagram illustrating detailed exemplary configurations of the NAND controller 140 and the memory chip 210 according to the embodiment. With reference to FIG. 5, the NAND controller 140-0, which controls the channel #0, will be described as a representative of the four NAND controllers 140, and the memory chip 210a will be described as a representative of the four memory chips 210a to 210d connected to the channel #0, as with FIGS. 3 and 4.

The memory chip 210a includes a control circuit 221, the memory cell array 222, a data register 223, a duty adjustment circuit 224, an IO terminal 225 for the signal DQ, and an IO terminal 226 for the data strobe signal DQS. Note that FIG. 5 omits illustrating an IO terminal for the chip enable signal CEn, an IO terminal for the command latch enable signal CLE, an IO terminal for the address latch enable signal ALE, an IO terminal for the write enable signal WEn, and an IO terminal for the read enable signal REn.

The control circuit 221 controls the operation of the memory chip 210 based on the chip enable signal CEn, the command latch enable signal CLE, the address latch enable signal ALE, and the write enable signal WEn.

The memory cell array 222 includes arrays of a plurality of memory cell transistors. Each of the memory cell transistors is connected to a bit line BL and a word line WL. The memory cell array 222 is capable of storing data in a nonvolatile manner.

The data register 223 has a given capacity. The given capacity corresponds to, for example, the size of a data read/write unit with respect to the memory cell array 222.

In the write operation, the signal DQ, which includes data to be written, and the data strobe signal DQS are transferred from the NAND controller 140-0 to the memory chip 210 via the IO terminal 225. The data is stored in the data register 223 at timings according to the data strobe signal DQS. The stored data is then written from the data register 223 to the memory cell array 222.

In the read operation, data is read from the memory cell array 222 and stored in the data register 223. The stored data is then partially or entirely read from the data register 223 at timings according to the read enable signal REn. The read enable signal REn is input to the duty adjustment circuit 224. The duty adjustment circuit 224 in the memory chip 210*a* performs waveform shaping such as duty adjustment to the read enable signal REn to generate the data strobe signal DQS. The memory chip 210*a* transfers the generated data strobe signal DQS via the IO terminal 226. Further, the memory chip 210*a* reads the data and transfers the data as the signal DQ from the data register 223 via the IO terminal 225. This data is synchronized with the generated data strobe signal DQS.

The NAND controller 140-0 includes, in addition to the WPLL 151 and the RPLL 152, a NAND command sequence control circuit 153, a command/address (Cmd/Adr) control circuit 154, a DQ/DQS transmission circuit 155, a DQ/DQS reception circuit 156, a first REn transmission circuit 157, a second REn transmission circuit 158, a write data path 159, a read data path 160, a first timer 161, a second timer 162, a switching circuit 163, an IO terminal 164 for the signal DQ, and an IO terminal 165 for the data strobe signal DQS.

The NAND command sequence control circuit 153, the Cmd/Adr control circuit 154, the DQ/DQS transmission circuit 155, the write data path 159, the first REn transmission circuit 157, and the first timer 161 operate on the write clock. The DQ/DQS reception circuit 156, the read data path 160, the second REn transmission circuit 158, and the second timer 162 operate on the read clock.

The Cmd/Adr control circuit 154 controls the transmission of the chip enable signal CEn, the command latch enable signal CLE, the address latch enable signal ALE, and the write enable signal WEn.

The DQ/DQS transmission circuit 155 transmits the signal DQ and the data strobe signal DQS. Specifically, in the write operation, the DQ/DQS transmission circuit 155 transmits the data strobe signal DQS and the signal DQ, which includes data to be written (hereinafter referred to as write data).

The write data path 159 acquires data from the outside of the NAND controller 140-0, specifically, from the write buffer 131 inside the RAM 130 to generate parity by performing error correction coding to the data. The write data path 159 generates write data by adding the generated parity to the data and transfers the write data to the DQ/DQS transmission circuit 155.

The DQ/DQS reception circuit 156 receives the signal DQ and the data strobe signal DQS. Specifically, in the read operation, the DQ/DQS reception circuit 156 receives the signal DQ as data, which has been read from the memory cell array 222 (hereinafter referred to as read data), and the data strobe signal DQS from the memory chip 210*a*, and acquires the read data in accordance with the data strobe signal DQS. As described above, the data strobe signal DQS received from the memory chip 210*a* is generated from the read enable signal REn. The data strobe signal DQS received from the memory chip 210*a* may have the same frequency as the read clock.

The read data path 160 performs error correction to the read data acquired by the DQ/DQS reception circuit 156 in accordance with the parity and transfers the error-corrected data to the outside of the NAND controller 140-0, specifically, to the read buffer 132 inside the RAM 130.

The first REn transmission circuit 157 and the second REn transmission circuit 158 transmit the read enable signal REn. The switching circuit 163 switchs a transmission circuit between the first REn transmission circuit 157 and the second REn transmission circuit 158 to transmit the read enable signal REn.

The first timer 161 and the second timer 162 serve as timer circuits that measure a time between two or more signals or a time between assertion and negation of a certain signal so that the timing between the signals or the timing between assertion and negation of the certain signal satisfies a given timing constraint. The timing constraint is also referred to as an alternating current (AC) specification. The first timer 161 measures the time by using a counter working on the write clock. The second timer 162 measures the time by using a counter working on the read clock.

The NAND command sequence control circuit 153 controls the NAND controller 140-0 as a whole. For each access type, the type of a command to transmit and the order of a command transfer, an address transfer, and a data transfer are preset. In executing access to the memory chip 210*a*, the NAND command sequence control circuit 153 controls the respective elements of the NAND controller 140-0 so as to transmit and receive a command, an address, and data to and from the memory chip 210*a* in the preset order.

Next, the operation of the memory system 1 according to the embodiment will be described.

In the write operation, the NAND command sequence control circuit 153 acquires data from the write buffer 131. The data (write data) is transmitted to the DQ/DQS transmission circuit 155 via the write data path 159. The NAND command sequence control circuit 153 instructs the Cmd/Adr control circuit 154 and the DQ/DQS transmission circuit 155 to transmit a command and an address. The command is a write command and the address indicates a storage location of the write data in the memory chip 210. The DQ/DQS transmission circuit 155 transmits the command and the address as the signal DQ to the memory chip 210 via the IC terminal 164. The Cmd/Adr control circuit 154 causes the chip enable signal CEn to transition to an active state (e.g., low level) in accordance with the instruction from the NAND command sequence control circuit 153 before start of the transmission of the command and the address. The Cmd/Adr control circuit 154 drives the command latch enable signal CLE, the address latch enable signal ALE, and the write enable signal WEn at timings according to the transmission of the command and the address. The DQ/DQS transmission circuit 155 transmits the signal DQ, i.e., the write data having passed through the write data path 159 via the IC terminal 164, and the data strobe signal DQS via the IC terminal 165. After completion of the write operation, the Cmd/Adr control circuit 154 causes the chip enable signal CEn to transition to an inactive state (e.g., high level).

The NAND command sequence control circuit 153, the Cmd/Adr control circuit 154, the DQ/DQS transmission circuit 155, and the write data path 159 operate on the write clock, therefore, the write data is transferred from the NAND controller 140 to the memory chip 210 in synchronization with the write clock. That is, in the write operation, the data transfer frequency from the memory controller 100 to the memory chip 210 can match the write clock frequency. Further, the chip enable signal CEn, the command latch enable signal CLE, the address latch enable signal ALE, the write enable signal WEn, and the signal DQ which includes the command and the address are transferred from the NAND controller 140 to the memory chip 210 in synchronization with the write clock.

In the read operation, the NAND command sequence control circuit 153 instructs the Cmd/Adr control circuit 154 and the DQ/DQS transmission circuit 155 to transmit a command and an address. The command is a read command and the address indicates a storage location of the read data in the memory chip 210. The DQ/DQS transmission circuit 155 transmits the command and the address as the signal DQ to the memory chip 210 via the IO terminal 164. The Cmd/Adr control circuit 154 places the chip enable signal CEn in an active state (e.g., low level) in accordance with the instruction from the NAND command sequence control circuit 153 before start of the transmission of the command and the address. The Cmd/Adr control circuit 154 drives the command latch enable signal CLE, the address latch enable signal ALE, and the write enable signal WEn at timings according to the transmission of the command and the address. The first REn transmission circuit 157 and the second REn transmission circuit 158 then transmit the read enable signal REn.

In the read operation, the chip enable signal CEn, the command latch enable signal CLE, the address latch enable signal ALE, the write enable signal WEn, and the signal DQ which includes the command and the address are transferred from the NAND controller 140 to the memory chip 210 in synchronization with the write clock, as in the write operation.

The read enable signal REn is toggled the number of times corresponding to the size of the read data. Before start of toggling the number of times corresponding to the size of the read data, the read enable signal REn, generated by the first REn transmission circuit 157 in synchronization with the write clock, is transmitted to the memory chip 210 via the switching circuit 163. At this point, only the first transition of the read enable signal REn, e.g., the transition from the high level to the low level, is transmitted. After transmission of the first transition of the read enable signal REn, the switching circuit 163 switches the transmission circuit to transmit the read enable signal REn from the first REn transmission circuit 157 to the second REn transmission circuit 158. The read enable signal REn, generated by the second REn transmission circuit 158 in synchronization with the read clock, is then transmitted to the memory chip 210 via the switching circuit 163.

The second REn transmission circuit 158 toggles the read enable signal REn the number of times corresponding to the size of the read data. After that, the switching circuit 163 switches the transmission circuit to transmit the read enable signal REn from the second REn transmission circuit 158 to the first REn transmission circuit 157.

In response to receipt of the read enable signal REn, the memory chip 210 reads data, having been read from the memory cell array 222 (namely, read data), from the data register 223 in accordance with the read enable signal REn. The memory chip 210 then transmits the signal DQ as the read data to the memory controller 100 via the IC terminal 225. Further, the memory chip 210 causes the duty adjustment circuit 224 to perform waveform shaping of the read enable signal REn and transmits the resultant read enable signal REn as the data strobe signal DQS to the memory controller 100 via the IC terminal 226. Thus, the memory chip 210 transmits the signal DQ which includes the data read from the data register 223, in synchronization with the data strobe signal DQS.

The read enable signal REn is toggled in synchronization with the read clock. The data strobe signal DQS that the memory chip 210 transmits to the memory controller 100 may have the same frequency as the read enable signal REn. Thus, the memory chip 210 can transfer read data at the same frequency as that of the read clock.

The NAND controller 140 receives the signal DQ, which includes the read data, and the data strobe signal DQS at the IC terminal 165. The DQ/DQS reception circuit 156 of the NAND controller 140 acquires the read data at timings according to the data strobe signal DQS. The read data, acquired by the DQ/DQS reception circuit 156, is transmitted via the read data path 160 to the outside of the NAND controller 140, specifically, the read buffer 132 inside the RAM 130.

Figure 6:
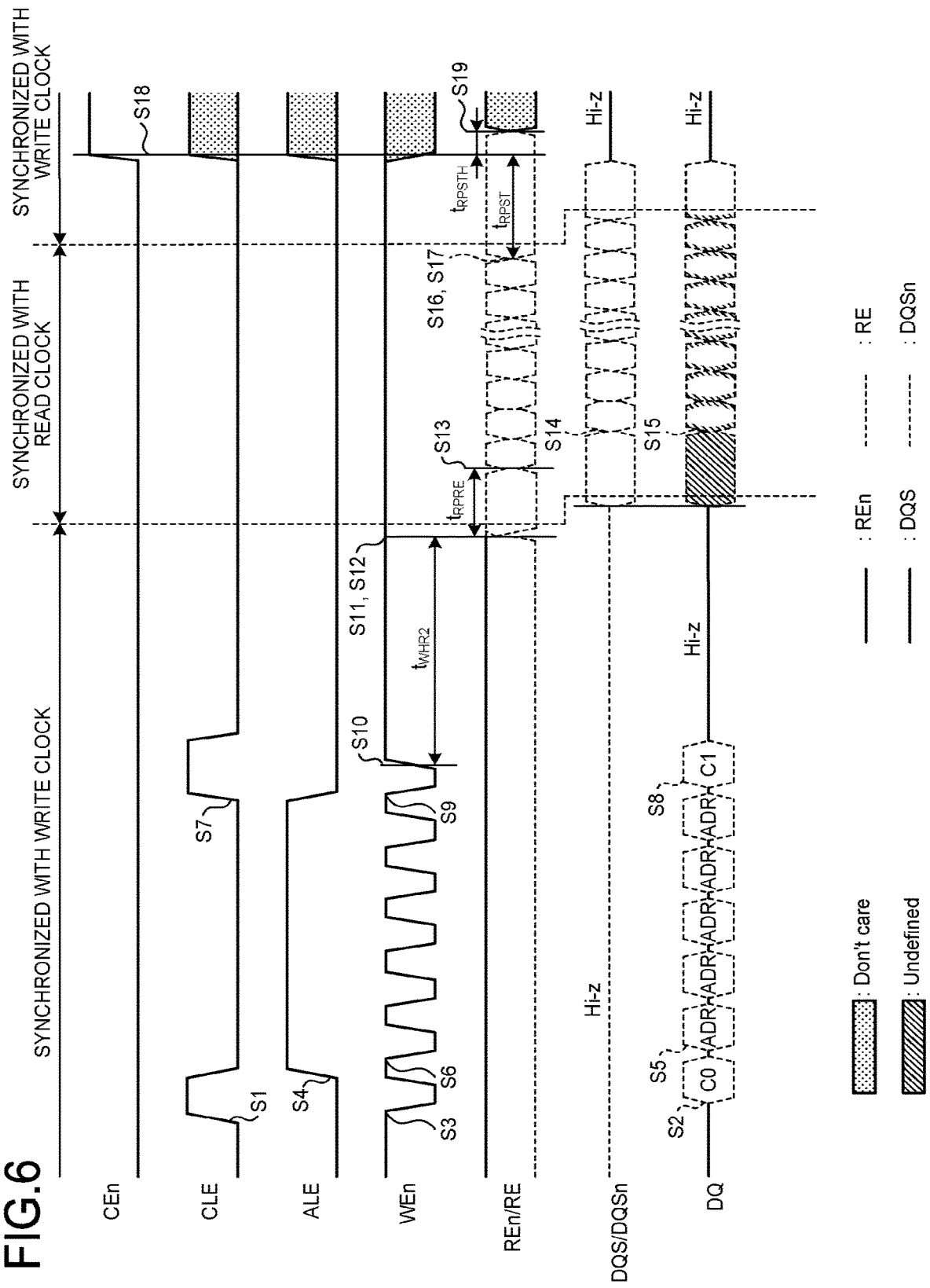
FIG. 6 is a timing chart for explaining an operation of the memory system in the read operation according to the embodiment.

FIG. 6 is a timing chart for explaining an operation of the memory system 1 in the read operation according to the embodiment. The timing chart illustrates a transfer operation of read data from the data register 223 of the memory chip 210 to the memory controller 100.

First, the Cmd/Adr control circuit 154 causes the chip enable signal CEn to transition to an active state (e.g., low level) (not illustrated). Next, the Cmd/Adr control circuit 154 causes the command latch enable signal CLE to transition to an active state (e.g., high level) (S1). During the active state of the command latch enable signal CLE, the DQ/DQS transmission circuit 155 transmits a command C0 as the signal DQ (S2). The command C0 indicates that a series of command sequences relates to data transfer from the memory chip 210 to the memory controller 100. In transmitting the command C0, the Cmd/Adr control circuit 154 toggles the write enable signal WEn to cause the memory chip 210 to acquire the command C0 (S3). Consequently, the command C0 is transferred in synchronization with the write enable signal WEn.

Herein, a command and an address, which are transmitted as the signals DQ, are acquired at rising timings of the write enable signal WEn by way of example.

The Cmd/Adr control circuit 154 causes the address latch enable signal ALE to transition to an active state (e.g., high level) (S4). During the active state of the address latch enable signal ALE, the DQ/DQS transmission circuit 155 transmits an address ADR as the signal DQ (S5). This address ADR indicates the head of a location in the data register 223 from which the data is to be read. In transmitting the address ADR, the Cmd/Adr control circuit 154 toggles the write enable signal WEn to cause the memory chip 210 to acquire the address ADR (S6). Consequently, the address ADR is transferred in synchronization with the write enable signal WEn.

In the example of FIG. 6, the address ADR is transmitted in five cycles. In other words, the write enable signal WEn is toggled five times. The number of cycles required to transmit the address ADR is not limited to five.

Subsequently, the Cmd/Adr control circuit 154 causes the command latch enable signal CLE to transition to an active state (e.g., high level) (S7). During the active state of the command latch enable signal CLE, the DQ/DQS transmission circuit 155 transmits a command C1 as the signal DQ (S8). The command C1 serves to provide an instruction to prepare for data transfer. In transmitting the command C1, the Cmd/Adr control circuit 154 toggles the write enable signal WEn to cause the memory chip 210 to acquire the command C1 (S9).

In response to receipt of the command C1, the memory chip 210 prepares for data transfer. The data transfer preparation includes a process of moving a read pointer to a location designated by the ADR and starting data transfer from the data register 223 to just before the IO terminal 225. When the IO signal line DQ has an 8-bit width, the read data is transferred every 8 bits. In such a case, in the data transfer preparation process, the memory chip 210 transfers the first 8 bits of the read data to the IO terminal 225.

The length of time required for the data transfer preparation is defined by the timing constraint. In FIG. 6, time $t_{WHR2}$ represents the length of time required for the data transfer preparation, defined by the timing constraint. A timing to acquire the command C1 (i.e., command C1 acquiring timing), which is specified by the write enable signal WEn, that is, the transfer completion timing of all of the commands C0 and C1 and the address ADR is defined as start timing of the time $t_{WHR2}$.

The memory chip 210 can receive the first transition (from high level to low level herein) of the read enable signal REn after the time $t_{WHR2}$ or more elapses from the command C1 acquiring timing. The IC terminal 225 and the IO terminal 226 are configured to be switchable in mode between an input mode for receiving a signal and an output mode for transmitting a signal. In response to receipt of the first transition of the read enable signal REn, the memory chip 210 causes the IC terminal 225 and the IC terminal 226 to be the output mode.

The length of time required for the mode setting of the IC terminal 225 and the IC terminal 226 is also defined by the timing constraint. In FIG. 6, Time $t_{RPRE}$ represents the length of time required for the mode setting of the IC terminal 225 and the IC terminal 226, defined by the timing constraint. The memory controller 100 can toggle the read enable signal REn the number of times corresponding to the size of the read data after the time $t_{RPRE}$ or more elapses from the first transition of the read enable signal REn.

The first timer 161 measures the time $t_{WHR2}$ in synchronization with the write clock after the command C1 acquiring timing. The second timer 162 measures the time $t_{RPRE}$ in synchronization with the read clock after the first transition of the read enable signal REn.

Specifically, the write enable signal WEn is toggled in S9, and at the rising timing of the write enable signal WEn (S10), the NAND command sequence control circuit 153 causes the first timer 161 to start measuring the time $t_{WHR2}$.

The first timer 161 measures the time with reference to the write clock. At the time when the measurement of the first timer 161 reaches a value corresponding to the time $t_{WHR2}$, the NAND command sequence control circuit 153 causes the first REn transmission circuit 157 to execute the first transition of the read enable signal REn (S11). At this time, the NAND command sequence control circuit 153 causes the switching circuit 163 to set the first REn transmission circuit 157 as the one to transmit the read enable signal REn. Consequently, the first transition of the read enable signal REn is transmitted from the first REn transmission circuit 157 to the memory chip 210.

Upon the read enable signal REn transitioning first, the NAND command sequence control circuit 153 causes the second timer 162 to start measuring the time $t_{RPRE}$, and causes the switching circuit 163 to switch the transmission circuit to transmit the read enable signal REn from the first REn transmission circuit 157 to the second REn transmission circuit 158 (S12).

The second timer 162 measures the time with reference to the read clock. The write clock and the read clock are independent of each other, that is, the read clock is asynchronous with the write clock. Thus, considering that the second timer 162 operates on the read clock, to start the second timer 162 at the timing synchronized with the write clock (e.g., the first transition of the read enable signal REn), the time indicated by a count value of the second timer 162 includes a synchronization loss of approximately one clock (one read clock). When the count value of the second timer 162 reaches a value corresponding to time obtained by subtracting the synchronization loss time from the time $t_{RPRE}$, the time $t_{RPRE}$ is inferred to elapse from the first transition of the read enable signal REn. That is, at the time when the count value of the second timer 162 reaches the value corresponding to the time obtained by subtracting the synchronization loss time from the time $t_{RPRE}$, the NAND command sequence control circuit 153 causes the second REn transmission circuit 158 to start toggling the read enable signal REn (S13). The second REn transmission circuit 158 toggles the read enable signal REn the number of times corresponding to the size of the read data.

The memory chip 210 receives the toggled read enable signal REn, after setting the mode of the IC terminal 225 and the IO terminal 226 to the output mode. The memory chip 210 causes the duty adjustment circuit 224 to perform waveform shaping of the read enable signal REn and transmits the resultant read enable signal REn as the data strobe signal DQS (S14). The memory chip 210 outputs the read data read as the signal DQ from the data register 223, in synchronization with the data strobe signal DQS generated from the read enable signal REn (S15).

After the second REn transmission circuit 158 toggles the read enable signal REn the number of times corresponding to the size of the read data, the NAND command sequence control circuit 153 causes the switching circuit 163 to switch the transmission circuit to transmit the read enable signal REn from the second REn transmission circuit 158 to the first REn transmission circuit 157 (S16). Simultaneously, the NAND command sequence control circuit 153 causes the first timer 161 to start measuring time $t_{RPST}$ (S17).

A hold time after completion of toggling the read enable signal REn the number of times corresponding to the size of the read data is defined by the timing constraint. In FIG. 6, the time $t_{RPST}$ represents the hold time. The NAND command sequence control circuit 153 detects an elapse of the hold time based on a count value of the first timer 161. Considering that the first timer 161 operates on the write clock, to start the first timer 161 at the timing synchronized with the read clock (e.g., the second REn transmission circuit 158's completion of the toggling of the read enable signal REn), the time indicated by the count value of the first timer 161 includes a synchronization loss of approximately one clock (one write clock). When the count value of the first timer 161 reaches a value corresponding to time obtained by subtracting the synchronization loss time from the time $t_{RPST}$, the time $t_{RPST}$ is inferred to elapse. Thus, at the time when the count value of the first timer 161 reaches the value corresponding to the time obtained by subtracting the synchronization loss time from the time $t_{RPST}$, the NAND command sequence control circuit 153 causes the Cmd/Adr control circuit 154 to cause the chip enable signal CEn to transition to an inactive state (e.g., high level) (S18).

After elapse of a given time (time $t_{RPSTH}$ in FIG. 6) from S18, the NAND command sequence control circuit 153 causes the first REn transmission circuit 157 to execute the final transition of the read enable signal REn (herein, transition from low level to high level) (S19). This completes the read operation.

According to the embodiment as described above, in the write operation, the memory controller 100 transfers to the memory chip 210, the data strobe signal DQS synchronized with the write clock and the write data synchronized with the data strobe signal DQS. In the read operation, the memory controller 100 transfers the read enable signal REn synchronized with the read clock to the memory chip 210. The read clock is higher in frequency than the write clock. In the read operation, the memory chip 210 generates the data strobe signal DQS synchronized with the read clock from the read enable signal REn, and transfers to the memory controller 100, the data strobe signal DQS and the read data synchronized with the data strobe signal DQS.

Thus, the memory system 1 can heighten the data transfer frequency in the read operation than the comparative memory system. That is, the memory system 1 according to the embodiment is capable of performing data transfer at a highest possible frequency in both the write operation and the read operation. In other words, it is possible to increase the frequency of data transfer between the memory controller 100 and the memory chip 210.

Further, the memory system 1 can satisfy, at a higher level, the customers' requests for improvement in the data read performance of the memory system rather than the data write performance.

According to the embodiment, in the read operation, the memory controller 100 transfers to the memory chip 210, the write enable signal WEn synchronized with the write clock, and the command and the address synchronized with the write enable signal WEn. The memory controller 100 then transfers the read enable signal REn to the memory chip 210.

The time $t_{WHR2}$ required for the process from completion of the command transfer and the address transfer to the first transition of the read enable signal REn is defined by the timing constraint. The memory controller 100 measures the time $t_{WHR2}$ using a counter working on the write clock. After completion of measuring the time $t_{WHR2}$, the memory controller 100 executes the first transition of the read enable signal REn.

Further, the memory controller 100 measures the time $t_{RPRE}$ using a counter working on the read clock after the first transition of the read enable signal REn. The time $t_{RPRE}$ represents the length of time required for preparation for data transfer, defined by the timing constraint. After completion of measuring the time $t_{RPRE}$, the memory controller 100 toggles the read enable signal REn, that is, causes a transition of the read enable signal REn in synchronization with the read clock.

Thus, both the timing constraints on the time $t_{WHR2}$ and on the time $t_{RPRE}$ can be satisfied.

A delay in the first transition timing of the read enable signal REn from elapse of the time $t_{WHR2}$ or a delay in the toggling start timing of the read enable signal REn from elapse of the time $t_{RPRE}$ may cause an increased command overhead, resulting in degrading the data read performance of the memory system. In the embodiment, the memory controller 100 is configured to measure both of the time $t_{WHR2}$ and the time $t_{RPRE}$ independently. Thereby, the memory controller 100 can prevent the delay in the first transition timing of the read enable signal REn and the delay in the toggling start timing of the read enable signal REn, which can avoid the memory system 1 from degrading in the data read performance.

According to the embodiment, after completion of measuring the time $t_{WHR2}$, the memory controller 100 toggles the read enable signal REn the number of times corresponding to the size of the read data in synchronization with the read clock.

After completion of the toggling of the read enable signal REn, the memory controller 100 measures the time $t_{RPST}$ with reference to the write clock. The time $t_{RPST}$ represents the hold time after the completion of toggling the read enable signal REn the number of times corresponding to the size of the read data. The hold time is defined by the timing constraint. After completion of measuring the time $t_{RPST}$, the memory controller 100 executes the final transition of the read enable signal REn at the timing according to the write clock.

Thus, the timing constraint on the time $t_{RPST}$ can be satisfied.

According to the embodiment, the memory controller 100 includes the WPLL 151 which generates the write clock, and the RPLL 152 which generates the read clock.

Such a structure enables the designer to individually set the write clock and the read clock at any frequency.

The memory controller 100 may not include the two clock generation circuits that generate the write clock and the read clock, respectively. The memory controller 100 may include only one clock generation circuit that generates the two clocks, i.e., the write clock and the read clock, by frequency-dividing a clock.

The memory chip 210 includes the duty adjustment circuit 224. In the read operation, the memory chip 210 causes the duty adjustment circuit 224 to generate the data strobe signal DQS by performing waveform shaping of the read enable signal REn.

Thus, the memory chip 210 can output data at a different rate from the rate of an operation based on the data strobe signal DQS in the write operation. In addition, the memory chip 210 can generate the data strobe signal DQS having the same frequency as the input read enable signal REn.

The above embodiment has described an example in which the read clock is higher in frequency than the write clock. However, the write clock may be higher in frequency than the read clock. For example, in the situation that it is difficult to set a higher data transfer frequency in the read operation than in the write operation due to design limitations, data can be transferred at a highest possible frequency in both the write operation and the read operation by setting the frequency of the write clock to higher than that of the read clock.

While certain embodiments have been described, these embodiments have been presented by way of example only, and are not intended to limit the scope of the inventions. Indeed, the novel methods and systems described herein may be embodied in different other forms; furthermore, various omissions, substitutions and varies in the form of the methods and systems described herein may be made without departing from the spirit of the inventions. The accompanying claims and their equivalents are intended to cover such forms or modifications as would fall within the scope and spirit of the inventions.

What is claimed is:

1. A memory system comprising:
   a memory chip; and
   a memory controller configured to:
   in a write operation,
      transfer at least a first command to the memory chip;
      transfer a first timing signal synchronized with a first clock to the memory chip; and
      transfer first data synchronized with the first timing signal to the memory chip, and,
   in a read operation,
      transfer at least a second command to the memory chip; and
      transfer a second timing signal synchronized with at least a second clock to the memory chip, the second clock having a frequency different from a frequency of the first clock, wherein
   the memory chip is configured to, in the read operation,
      generate a third timing signal synchronized with the second clock based on the second timing signal; and transfer second data synchronized with the third timing signal to the memory controller.

2. The memory system according to claim 1, wherein the second timing signal is further synchronized with the first clock in a first period that is different from a second period in which the second timing signal is synchronized with the second clock, and the memory controller is configured to:

after transferring the second command to the memory chip, transfer the second timing signal synchronized with the first clock to the memory chip; and transfer the second timing signal synchronized with the second clock to the memory chip.

3. The memory system according to claim 2, wherein the memory controller is further configured to:

after transferring the second command to the memory chip, measure a first time length by using a first timer that works on the first clock; and upon the first timer detecting that the first time length has reached a first value, transfer the second timing signal synchronized with the first clock to the memory chip.

4. The memory system according to claim 3, wherein the memory controller is further configured to:

after transferring the second timing signal synchronized with the first clock to the memory chip, measure a second time length using a second timer that works on the second clock; and upon the second timer detecting that the second time length has reached a second value, transfer the second timing signal synchronized with the second clock to the memory chip.

5. The memory system according to claim 4, wherein the memory controller is further configured to:

upon the second timer detecting that the second time length has reached the second value, toggle the second timing signal synchronized with the second clock a number of times corresponding to a size of the second data.

6. The memory system according to claim 5, wherein the memory controller is further configured to:

upon the second timing signal being toggled the number of times corresponding to the size of the second data, measure a third time length using the first timer that works on the first clock; and upon the first timer detecting that the third time length has reached a third value, transfer the second timing signal synchronized with the first clock to the memory chip.

7. The memory system according to claim 1, wherein the memory controller is further configured to, in the read operation, transfer an address synchronized with the first clock to the memory chip.

8. The memory system according to claim 1, further comprising:

a first signal line that connects the memory controller and the memory chip;

a second signal line that connects the memory controller and the memory chip; and a third signal line that connects the memory controller and the memory chip, wherein the memory controller is configured to, in the read operation, using the first signal line, transfer the second command to the memory chip; and using the second signal line, transfer the second timing signal synchronized with at least the second clock to the memory chip, and the memory chip is configured to, in the read operation, using the third signal line, transfer the third timing signal synchronized with the second clock to the memory controller.

9. The memory system according to claim 8, wherein the memory chip is configured to, in the read operation, using the first signal line, transfer the second data synchronized with the third timing signal to the memory controller, and the memory controller is configured to, in the write operation, using the third signal line, transfer the first timing signal synchronized with the first clock to the memory chip; and using the first signal line, transfer the first data synchronized with the first timing signal to the memory chip.

10. The memory system according to claim 1, wherein each of the first command and the second command is synchronized with the first clock.

11. A method of controlling a memory chip, comprising:

in a write operation, transferring at least a first command to the memory chip;
transferring a first timing signal synchronized with a first clock to the memory chip; and
transferring first data synchronized with the first timing signal to the memory chip, and in a read operation, transferring at least a second command to the memory chip;
transferring a second timing signal synchronized with at least a second clock to the memory chip, the second clock having a frequency different from a frequency of the first clock; and
causing the memory chip to transfer second data synchronized with a third timing signal, the third timing signal being generated to be synchronized with the second clock based on the second timing signal.

12. The method according to claim 11, wherein the second timing signal is further synchronized with the first clock in a first period that is different from a second period in which the second timing signal is synchronized with the second clock, and the method further comprises:

after transferring the second command to the memory chip, transferring the second timing signal synchronized with the first clock to the memory chip; and transferring the second timing signal synchronized with the second clock to the memory chip.

13. The method according to claim 12, further comprising:

after transferring the second command to the memory chip, measuring a first time length by using a first timer that works on the first clock; and upon the first timer detecting that the first time length has reached a first value, transferring the second timing signal synchronized with the first clock to the memory chip.

14. The method according to claim 13, further comprising:

after transferring the second timing signal synchronized with the first clock to the memory chip, measuring a second time length using a second timer that works on the second clock; and upon the second timer detecting that the second time length has reached a second value, transferring the second timing signal synchronized with the second clock to the memory chip.

15. The method according to claim 14, further comprising:
upon the second timer detecting that the second time length has reached the second value, toggling the second timing signal synchronized with the second clock a number of times corresponding to a size of the second data.

16. The method according to claim 15, further comprising:
upon the second timing signal being toggled the number of times corresponding to the size of the second data, measuring a third time length using the first timer that works on the first clock; and
upon the first timer detecting that the third time length has reached a third value, transferring the second timing signal synchronized with the first clock to the memory chip.

17. The method according to claim 11, further comprising:
in the read operation,
transferring an address synchronized with the first clock to the memory chip.

18. The method according to claim 11, wherein
the second command is transferred to the memory chip by using a first signal line,
the second timing signal synchronized with at least the second clock is transferred to the memory chip by using a second signal line, and
the third timing signal synchronized with the second clock is transferred from the memory chip by using a third signal line.

19. The method according to claim 18, wherein
the second data synchronized with the third timing signal is transferred from the memory chip by using the first signal line,
the first timing signal synchronized with the first clock is transferred to the memory chip by using the third signal line, and
the first data synchronized with the first timing signal is transferred to the memory chip by using the first signal line.

20. The method according to claim 11, wherein
each of the first command and the second command is synchronized with the first clock.

* * * * *